United States Patent
Kawabata et al.

(10) Patent No.: US 6,212,091 B1
(45) Date of Patent: Apr. 3, 2001

(54) SEMICONDUCTOR MEMORY DEVICE HAVING A SHIELDING LINE

(75) Inventors: Kuninori Kawabata; Masato Matsumiya; Satoshi Eto; Akira Kikutake, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/514,313

(22) Filed: Feb. 28, 2000

(30) Foreign Application Priority Data

Apr. 28, 1999 (JP) .................................................. 11-122362

(51) Int. Cl.⁷ ....................................................... G11C 5/06

(52) U.S. Cl. .................................. 365/63; 365/51; 365/53; 365/214

(58) Field of Search .................................. 365/63, 51, 53, 365/206, 214

(56) References Cited

U.S. PATENT DOCUMENTS

| | | | | |
|---|---|---|---|---|
| 5,072,425 | * | 12/1991 | Kohno et al. | 365/226 |
| 5,754,481 | * | 5/1998 | Yabe et al. | 365/189.05 |
| 5,838,604 | * | 11/1998 | Tsuboi et al. | 365/63 |
| 6,088,283 | * | 7/2000 | Hayashi | 365/230.03 |

* cited by examiner

*Primary Examiner*—Son Mai
(74) *Attorney, Agent, or Firm*—Arent Fox Kintner Plotkin & Kahn, PLLC

(57) ABSTRACT

A semiconductor memory device has data bus lines which are connected to a memory cell array, and column selection lines, each of which is used to select a column of the memory cell array. The semiconductor memory device includes a shielding line placed between the column selection line and a data bus line adjacent to the column selection line. The shielding line electrically shields the data bus line from the column selection line. Therefore, the semiconductor memory device having the high speed data bus can be achieved because the coupling capacitance between the column selection line and the data bus line is reduced.

10 Claims, 7 Drawing Sheets

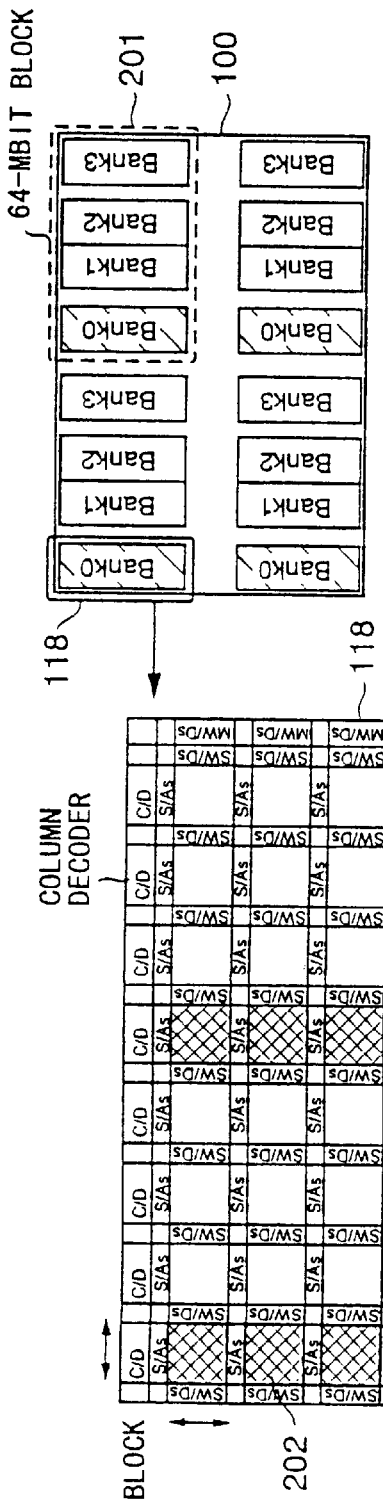
FIG. 2A PRIOR ART
FIG. 2B PRIOR ART
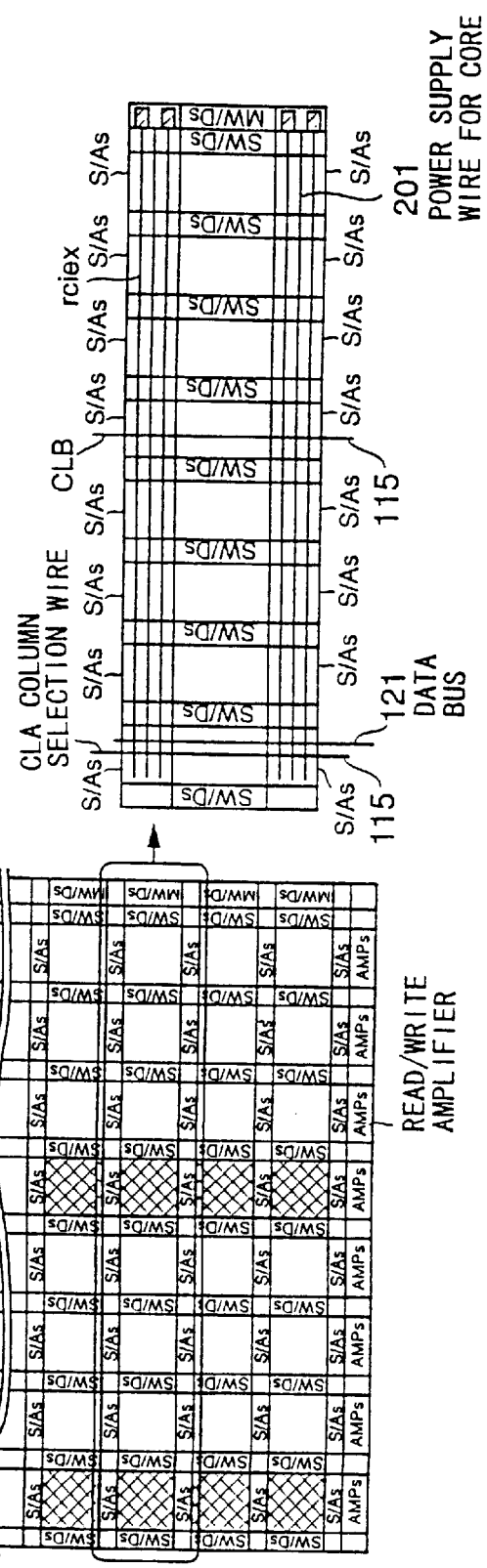
FIG. 2C PRIOR ART

SEMICONDUCTOR MEMORY DEVICE HAVING A SHIELDING LINE

BACKGROUND OF THE INVENTION

1. Field of the Invention

The present invention generally relates to a semiconductor memory device, and more particularly to a layout of a line for shielding a data bus from a column selection line in a semiconductor memory device.

2. Description of the Related Art

FIG. 1 shows a block diagram of a conventional synchronous dynamic random access memory (SDRAM) which is one type of dynamic random access memories. An SDRAM 100 mainly includes a command decoder 101, a column control circuit 102, a row control circuit 103 and memory banks 118-1 to 118-N. Each of the memory banks 118-1 to 118-N has a row address buffer 104, a row-decoder 105, a memory cell array 106, a column address buffer 107, a column-decoder 108, a sense amplifier block 109, the read/write amplifier block 120 which includes the read amplifier block 110 and the write amplifier block 111 and the input/output control circuit 112. A clock signal CLK, a row address strobe signal RAS, a column address strobe signal CAS, a write enable signal WE, a chip selection signal CS, a clock enable signal CKE and address signals A0 to A15 are supplied to the SDRAM 100 and data DQ is input to or output from the SDRAM 100 based on the signals. The command decoder 101 and the input/output control circuit 112 in the SDRAM 100 operate synchronously with the clock signal CLK. A command which is defined by the row address strobe signal RAS, the column address strobe signal CAS, the write enable signal WE, the chip selection signal CS and the clock enable signal CKE are decoded by the command decoder 101.

An output signal of the command decoder 101 is supplied to the column control circuit 102 and the row control circuit 103. The row control circuit 103 controls the row address buffer 104. The row address buffer 104 supplies the address signals A0–A15 to the row-decoder 105. The row-decoder 105 decodes the address signals A0–A15 and a row in the memory cell array 106 is selected by an output of the row-decoder 105. Then, data is read from or written to cells in the row of the memory cell array 106.

On the other hand, the column control circuit 102 controls the column address buffer 107. The column address buffer 107 supplies the address signals A0–A15 to the column-decoder 108. The column-decoder 108 decodes the address signals A0–A15, and sense amplifiers in the sense amplifier block 109 are selected by an output of the column-decoder 108. Then, data is read or written through the sense amplifiers in the sense amplifier block 109. The column control circuit 102 selects the read amplifier block 110 according to an output of the command decoder 101 when data is read from the memory cell array 106. The read data is supplied from the sense amplifier block 109 to the input/output circuit 112 through the read amplifier 110. Then, the data DQ is output from the input/output circuit 112. On the other hand, the column control circuit 102 selects the write amplifier block 111 according to the output of the command decoder 101 when the data DQ is written to the memory cell array 106. Then, the data DQ supplied to the input/output circuit 112 is transferred to the write amplifier 111, and is written to the cell in the memory cell array 106 through the sense amplifier block 109.

FIGS. 2A, 2B and 2C show an outline of a 256-Mbit SDRAM. More particularly, FIG. 2A shows the outline of a chip of the 256-Mbit SDRAM. The SDRAM 100 has four 64-Mbit blocks. One of the 64-Mbit blocks 201 has four banks Bank0 to Bank3. FIG. 2B shows a construction of one of the banks Bank0. The Bank0 118 corresponds to the Bank0 in FIG. 1. The Bank0 is divided into sixteen blocks in a vertical direction and eight blocks in a horizontal direction. As a result, the Bank0 has 128 small blocks. The Bank0 has the 128 small blocks 202, sense amplifiers S/As, read/write amplifiers AMPs, main-row-decoders MW/Ds, sub-row-decoders SW/Ds and column-decoders C/Ds. The sense amplifiers S/As correspond to the sense amplifier block 109 shown in FIG. 1, the read/write amplifiers AMPs correspond to the read/write amplifier block 120, the main-row-decoders MW/Ds and the sub-row-decoders SW/Ds correspond to the row-decoder 105 and the column-decoders C/Ds correspond to the column-decoder 108.

One small block 202 has 128-kbit memory cells. The sub-row-decoders SW/Ds and the sense amplifiers S/As are placed around the small block 202. The column-decoder C/Ds is placed on the top of each column and the sense amplifiers S/As is placed at the bottom of each column. Each row has one main-row-decoder MW/Ds. FIG. 2C shows a construction of one row of the Bank0. A power supply line 210 for core is placed parallel to the row. A column selection line 115 from the column-decoder C/Ds and a data bus 121 are placed perpendicularly to the row. Therefore, the column selection line 115 and the data bus 121 are placed in a direction parallel to the column.

However, the prior art described above has a drawback. FIG. 3A shows a layout of conventional column selection lines CLA, CLB and FIG. 3B shows a data bus line 121, and a signal on the data bus line 121 when data is read from the memory cell block 106. The column selection lines CLA and CLB shown in FIG. 3A correspond to two column selection lines CLA and CLB shown in FIG. 2C. The data bus line 121 shown in FIG. 3A corresponds to the data bus line 121 which is placed parallel to the column selection lines CLA and CLB shown in FIG. 2C. The column selection line CLA is coupled to the data bus line 121 through a coupling capacitor 310 having a capacitance Cp. The data bus line 121 is coupled to a ground through a capacitor 311 having a capacitance Cdb. In case of a low integration degree DRAM, the capacitance Cp of the coupling capacitor 310 is low because a distance between the column selection line CLA and the data bus line 121 parallel to it is long. Therefore, a signal on the column selection line CLA does not affect the data bus line 121. However, recently, the distance between the column selection line CLA and the data bus line 121 is short because of a fine process to achieve a large scale integration and a multi-bit structure to achieve a wide band width of DRAMs. As a result, the capacitance Cp of the coupling capacitor 310 between the column selection line CLA and the data bus line 121 becomes high, so that the signal on the column selection line CLA affects the data bus line 121. Especially, a cross-talk due to the coupling capacitor 310 causes a problem because a signal amplitude on the data bus line 121 is too low so as to achieve a high speed operation and low power consumption.

FIG. 3B shows a signal 301 on the column selection line CLB, a signal 302 on the data bus 121 and an activation signal 303 for the read/write amplifier AMPs when the signal on the column selection line CLB does not affect the data bus line 121 because the capacitance Cp of the coupling capacitor 310 is low. FIG. 3C shows a signal 304 on the column selection line CLA, a signal 302 on the data bus 121 and an activation signal 303 for the read/write amplifier AMPs when the signal on the column selection line CLA affects the data bus line 121 because the capacitance Cp of the coupling capacitor 310 is high. In FIG. 3B, when the signal 301 on the column selection line CLB rises, the signal 302 on the data bus line 121 starts to decrease. When the value of the signal 302 decreases by Vdb, the activation signal 303 for the read/write amplifier AMPs rises and the read/write amplifier AMPs senses the signal 302 on the data bus line 121.

On the other hand, in FIG. 3C. a voltage variation Vp caused by a cross-talk due to the coupling capacitor 310 occurs. The voltage variation Vp on the data bus line 121 from the column selection line CLA is, $$Vp = Cp \times Vcl/(Cdb+Cp)$$

where Vcl is a voltage amplitude of the signal 304 on the column selection line CLA. Therefore, when the signal 304 on the column selection line CLA rises, the signal 302 on the data bus line 121 increases by Vp. Then, the signal 304 on the data bus line 121 decreases at the same rate as that of the signal 302 on the data bus line 121 shown in FIG. 3B. As a result, the activation signal 303 for the read/write amplifier AMPs needs to be activated after the signal 302 on the data bus line 121 decreases by Vdb+Vp. Therefore, a time interval between a rise point of the signal 304 and a rise point of the signal 303 in FIG. 3C is longer than a time interval between a rise point of the signal 301 and a rise point of the signal 303 in FIG. 3B.

Furthermore, the signal 302 may not reach the voltage Vdb by a point of time if the voltage Vp is very high. This causes a mis-detection of the data on the data bus line 121 by the read/write amplifier AMPs. When the voltage Vp is high, it is required to delay the activation of the read/write amplifier AMPs. Therefore, the coupling capacitance 310 of the coupling capacitor existing between the column selection line CLA and the data bus line 121 which is placed parallel to the column selection line CLA decreases an operation speed of the data bus line 121. This occurs when the data is read from the memory cell 106 and when the data is written to the memory cell 106.

SUMMARY OF THE INVENTION

It is a general object of the present invention to provide a semiconductor memory device in which the above disadvantages are eliminated.

A more specific object of the present invention is to provide a semiconductor memory device in which a capacitance of a coupling capacitor existing between a column selection line and a data bus line is reduced to achieve a high speed operation of a data bus.

The above objects of the present invention are achieved by a semiconductor memory device having data bus lines which are connected to a memory cell array, and column selection lines, each of which is used to select a column of the memory cell array. The semiconductor memory device includes a shielding line placed between the column selection line and a data bus line adjacent to the column selection line.

The shielding line electrically shields the data bus line from the column selection line. Therefore, the semiconductor memory device having the high speed data bus can be achieved because the coupling capacitance between the column selection line and the data bus line is reduced.

BRIEF DESCRIPTION OF THE DRAWINGS

Other objects, features and advantages of the present invention will become more apparent from the following detailed description when read in conjunction with the accompanying drawings, in which:

FIGS. 2A, 2B and 2C show an outline of a 256-Mbit SDRAM;

DESCRIPTION OF THE PREFERRED EMBODIMENTS

Figure 1:
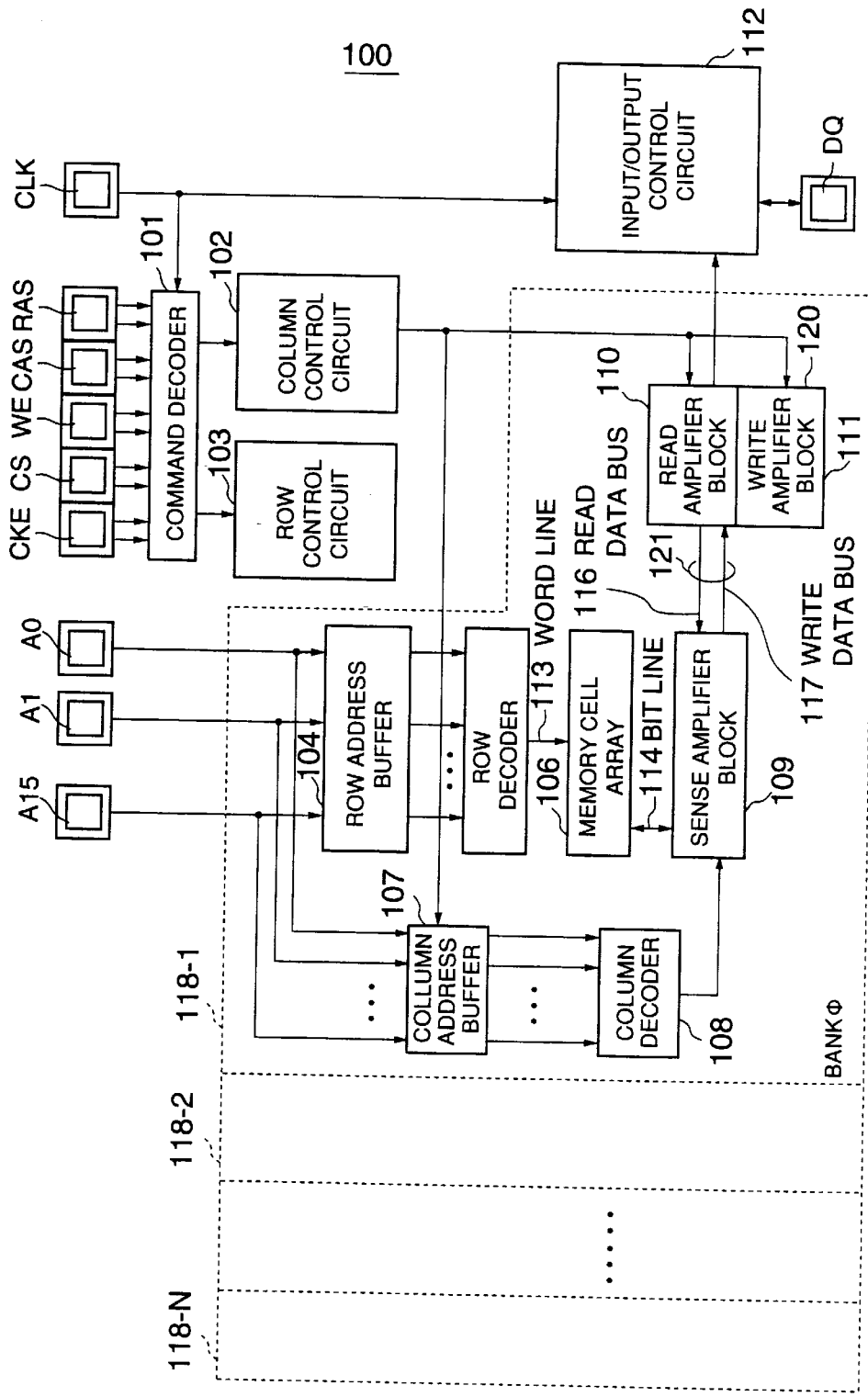
FIG. 1 shows a block diagram of a conventional synchronous dynamic random access memory (SDRAM)
Figure 4A:
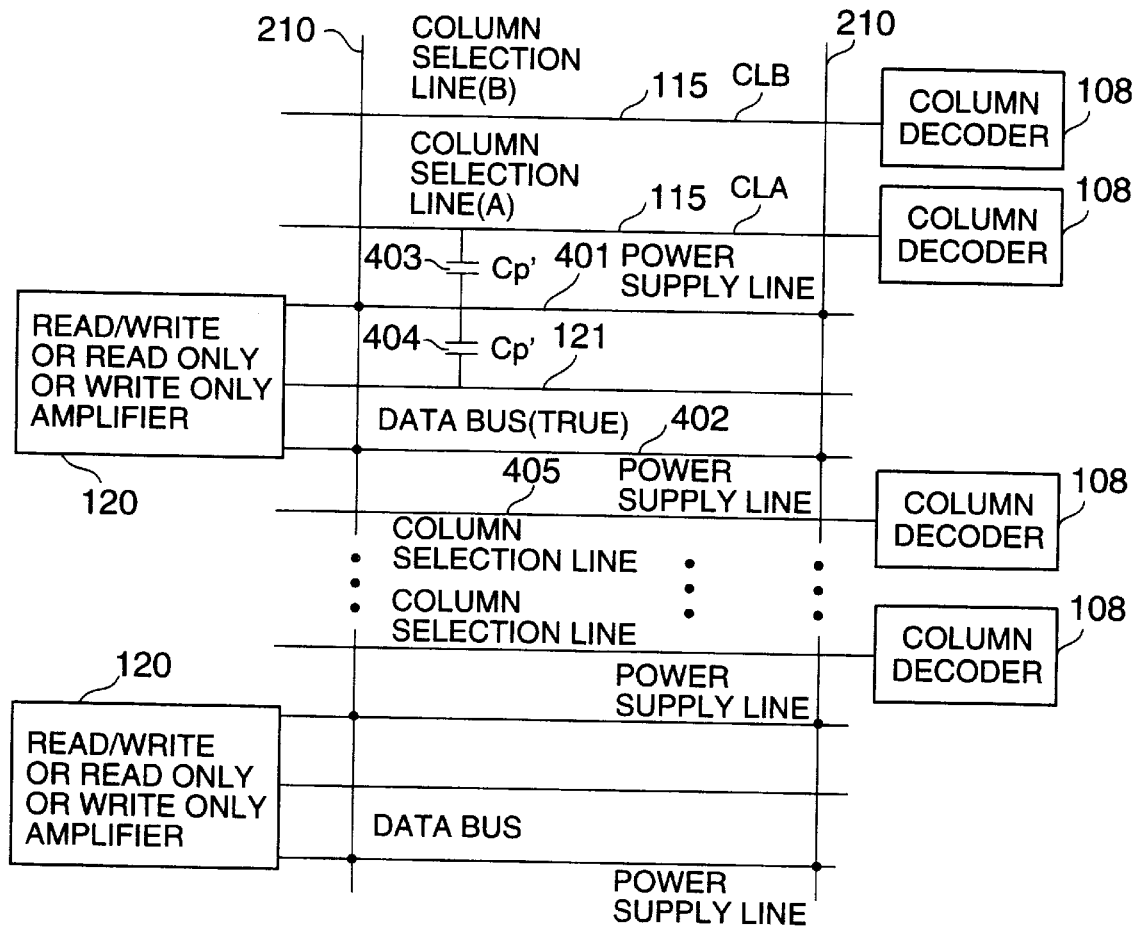
FIGS. 4A and 4B show a first embodiment of a semiconductor memory device according to the present invention.
Figure 4B:
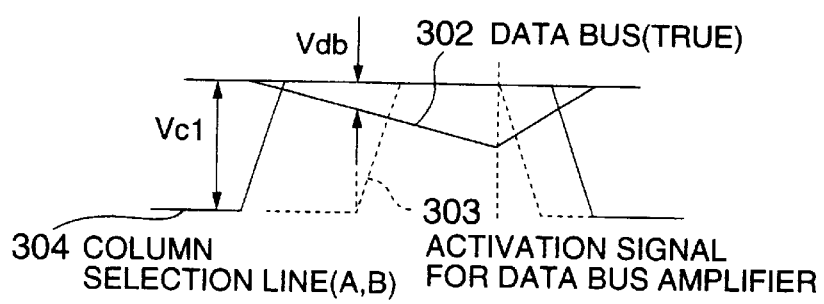

FIG. 4A and FIG. 4B show a first embodiment of a semiconductor memory device according to the present invention. More particularly, FIG. 4A shows a layout of a power supply line 210 for a core of an SDRAM, a column selection line 115 and a data bus line 121, as shown in FIG. 2C. The column selection line 115 and the data bus line 121 are commonly used for both reading and writing data in this embodiment. Therefore, a selection of sense amplifiers in the sense amplifier block 109 shown in FIG. 1 is performed by the column selection line 115 when data is read from or written to the memory cell array 106. A data transmission between the sense amplifier block 109 and the read/write amplifier 120 is performed by a read/write data bus or a read only data bus or a write only data bus.

In FIG. 4A, a shielding line 401 connected to the power supply line 210 is placed between the column selection line CLA and the data bus line 121 which is placed parallel to the column selection line CLA. FIG. 4B shows signal waveforms thereof. The shielding line 401 connected to the power supply line 210 is the same line as shown in FIG. 2C. The shielding line 401 perpendicularly connected to the power supply line 210 is placed between the column selection line CLA from the column-decoder 108 and the data bus line 121 from the read/write amplifier 120. The shielding line 401 is parallel to the data bus line 121.

Figure 3A:
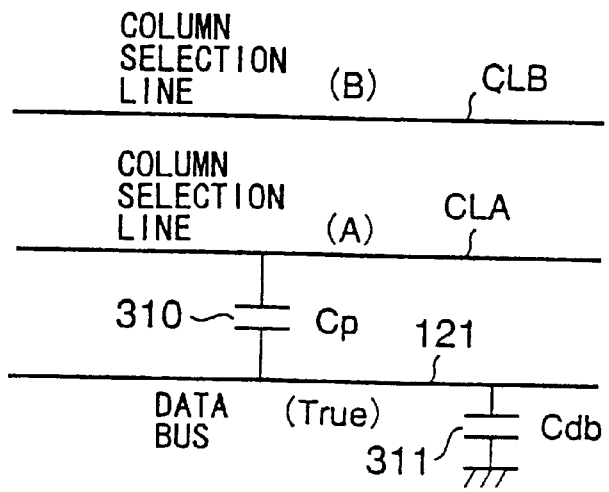
FIGS. 3A, 3B and 3C show a layout of conventional column selection lines and a data bus line, and signals when data is read from the memory cell.

Let Cp' be a capacitance of a capacitor 403 existing between the column selection line CLA and the shielding line 401. A capacitance of a capacitor 404 existing between the data bus line 121 and the shielding line 401 is also Cp'. The capacitance Cp' is a little larger than the capacitance Cp of the capacitor 310 existing between the column selection line CLA and the data bus 121 shown in FIG. 3A. The data bus line 121 is shielded from the column selection line CLA by the power supply line 401 because the capacitors 403 and 404 are connected to the shielding line 401 having a constant voltage potential. Furthermore, the capacitance between the column selection line CLA and the data bus line 121 is reduced because the capacitor 403 and 404 are serially connected. A capacitance between the column selection line 405 and the data bus line 121 is also reduced in the same way.

Figure 3B:
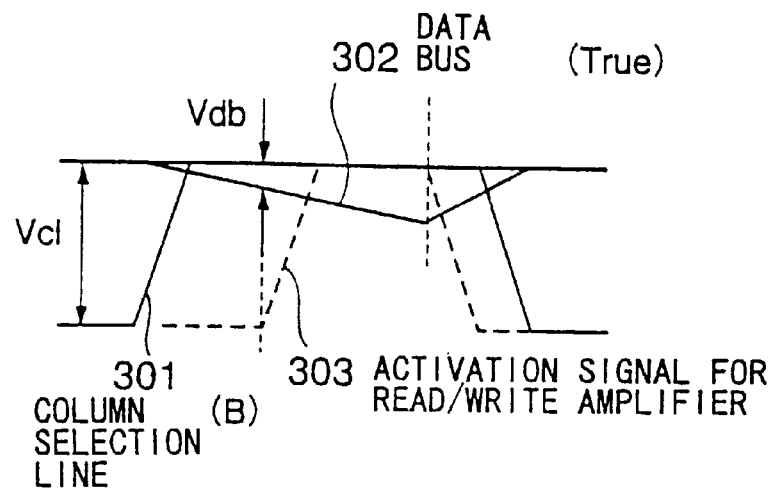
Figure 3C:
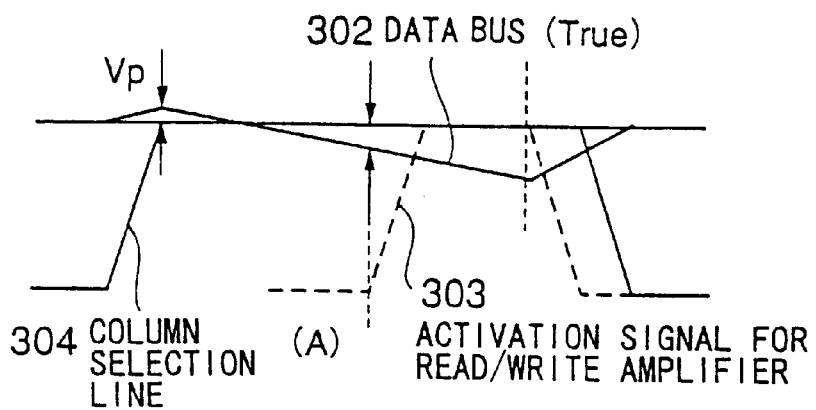

FIG. 4B shows a signal 304 on the column selection line CLA, a signal 302 on the data bus line 121 and an activation signal 303 for the read/write amplifier AMPs. A voltage variation Vp due to a cross-talk by a coupling capacitor existing between the column selection line CLA and the data bus line 121 is not generated similarly as shown in FIG. 3B. Therefore, when the signal 304 on the column selection line LCA rises, the signal 302 on the data bus 121 starts to decrease. When the value of the signal 302 decreases by Vdb, the activation signal 303 for the read/write amplifier AMPs rises and the read/write amplifier AMPs correctly senses the signal 304 on the data bus line 121.

As mentioned above, the shielding line 401 connected to the the power supply line 210 electrically shields the data bus line 121 from the column selection line CLA. As a result, the semiconductor memory device having the high-speed data bus can be achieved because the coupling capacitance of the coupling capacitor existing between the column selection line CLA and the data bus line 121 is reduced.

In this embodiment, a resistance of the power supply line for the core is also reduced because a total area of the power supply line is increased. Therefore, a voltage variation of the power supply is reduced, so that a voltage of the power supply can be stabilized.

The shielding line 401 connected to the power supply line 210 is used to describe this embodiment. However, it is obvious that any types of shielding lines connected to the power supply lines can also be used in place of this types of the shielding line connected to the power supply line shown in FIG. 4A.

In this embodiment, the power supply line for the core is used for a shielding line. However, it is obvious that a ground line which supplies the core with a ground potential can also be used to shield the data bus line from the column selection line.

Figure 5:
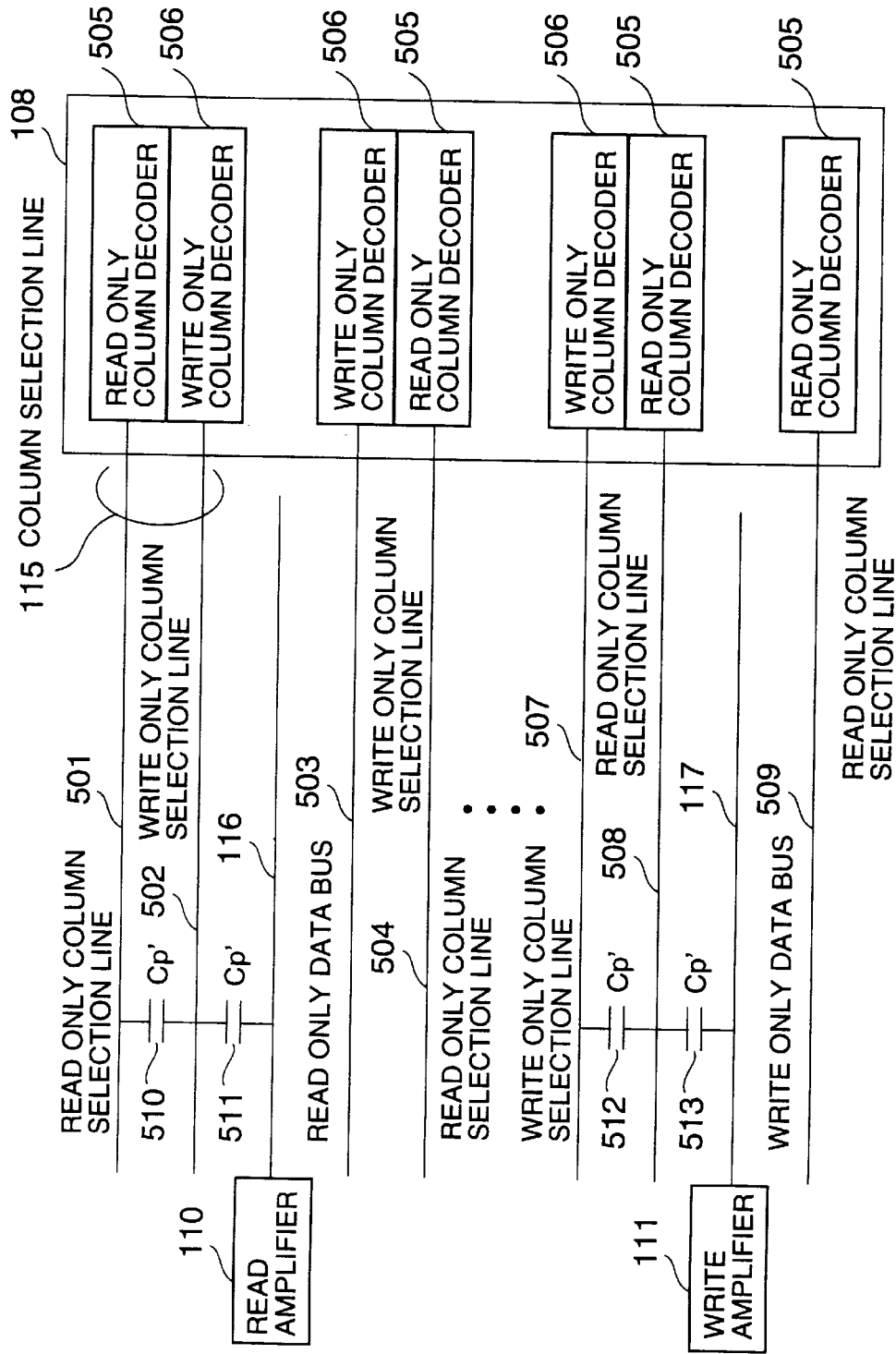
FIG. 5 shows a second embodiment of a semiconductor memory device according to the present invention.

Next, a second embodiment of the present invention will be explained. FIG. 5 shows the second embodiment of the semiconductor memory device according to the present invention. FIG. 5 shows a layout of a write only or read only column selection line which serves as a shielding line placed between a read only or write only column selection line and a read only or write only data bus line. In this embodiment, the column-decoder 108 shown in FIG. 1 has a read only column-decoder 505 and a write only column-decoder 506. Therefore, the sense amplifiers in the sense amplifier block 109 shown in FIG. 1 are selected by the read only column-decoder 505 through read only column selection lines 501, 504, 508 and 509 when data is read from the memory cell array 106, and the sense amplifiers in the sense amplifier block 109 shown in FIG. 1 are selected by the write only column-decoder 506 through write only column selection lines 502, 503 and 507 when data is written to the memory cell array 106. A data transmission between the sense amplifier block 109 and the read/write amplifier 120 is performed by the read only data bus 116 connected to the read amplifier 110 when data is read, and by the write only data bus 117 connected to the write amplifier 111 when data is written. In this embodiment, the write only column selection line 502 is placed between the read only column selection line 501 and a read only data bus line 116, and the read only column selection line 508 is placed between the write only column selection line 507 and a write only data bus line 117.

First, a description will be given of an example in which the write only column selection line 502 is placed between the read only column selection line 501 and the read only data bus line 116.

Let Cp' be a capacitance of a capacitor 510 existing between the read only column selection line 501 and the write only column selection line 502. A capacitance of a capacitor 511 existing between the write only column selection line 502 and the read only data bus line 116 is also Cp'. The capacitance Cp' is a little larger than the capacitance Cp of the capacitor 310 existing between the column selection line CLA and the data bus 121 shown in FIG. 3A. The read only data bus line 116 is shielded from the read only column selection line 501 by the write only column selection line 502 because the capacitors 510 and 511 are connected to the write only column selection line 502 having a constant voltage potential. Furthermore, the capacitance between the read only column selection line 501 and the read only data bus line 116 is reduced because the capacitor 510 and 511 are serially connected. The signal on the write only column selection line 502 does not change when the data on the read only data bus line 116 supplied from the memory cell array 106 selected by the read only column selection line 501 is transferred to the read amplifier 110. Therefore, a voltage variation Vp due to a cross-talk by a coupling capacitor existing between the read only column selection line 501 and the read only data bus line 116 is not generated similarly as shown in FIG. 4B when a signal on the read only column selection line 501 rises.

As a result, the semiconductor memory device having the high speed data bus 116 can be achieved because the coupling capacitance Cp between the read only column selection line 501 and the read only data bus line 116 is reduced.

On the other hand, the same effect as mentioned above can be achieved if the read only column selection line 508 is placed between the write only column selection line 507 and a write only data bus line 117.

Figure 6:
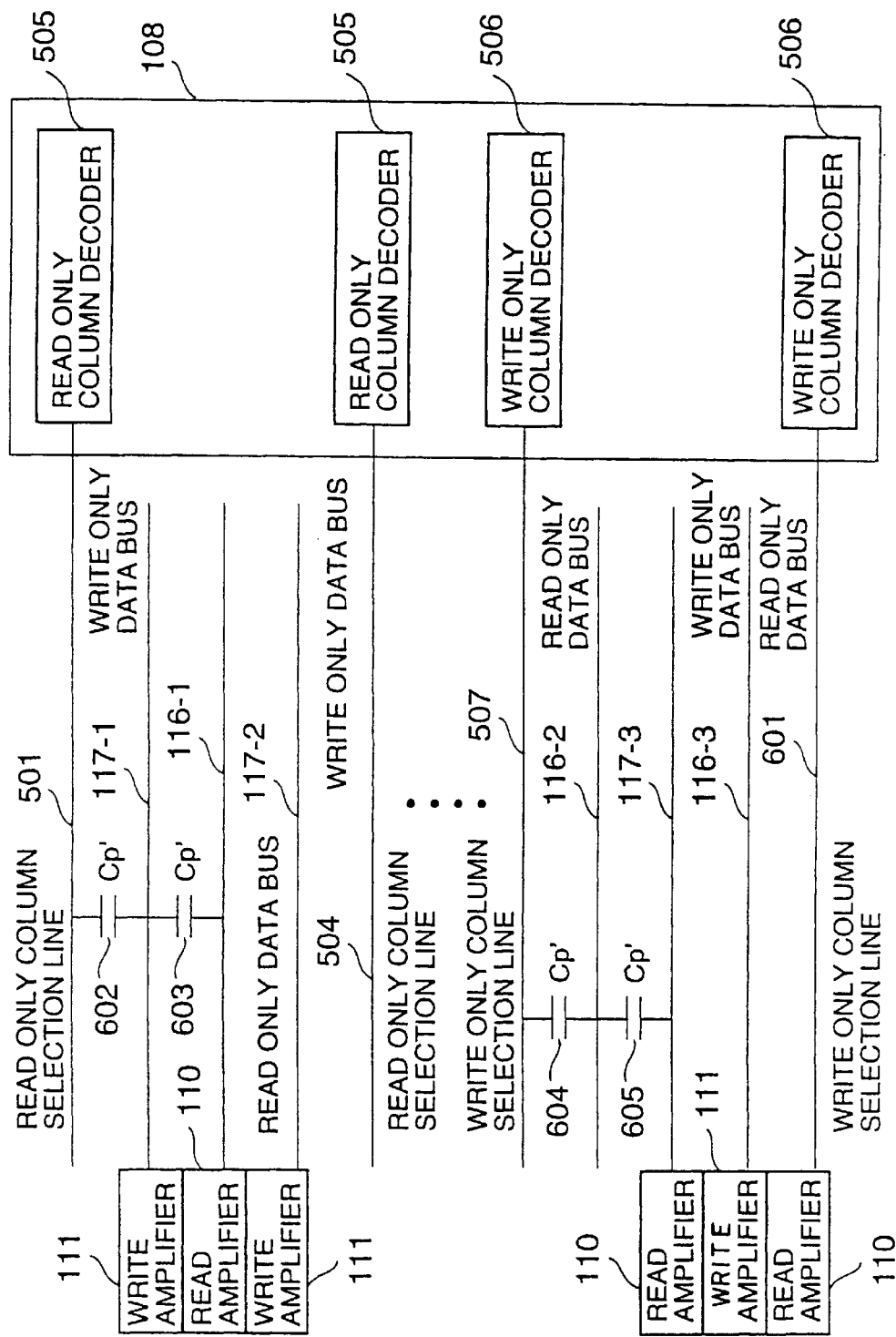
FIG. 6 shows a third embodiment of a semiconductor memory device according to the present invention.

Next, a third embodiment of the present invention will be explained. FIG. 6 shows the third embodiment of the semiconductor memory device according to the present invention. FIG. 6 shows a layout of a write only or read only data bus line which serves as a shielding line placed between a read only or write only column selection line and a read only or write only data bus line. In this embodiment, the sense amplifiers in the sense amplifier block 109 shown in FIG. 1 are selected by the read only column-decoder 505 through read only column selection lines 501 and 504 when data is read from the memory cell array 106, and the sense amplifiers in the sense amplifier block 109 shown in FIG. 1 are selected by the write only column-decoder 506 through write only column selection lines 507 and 601 when data is written to the memory cell array 106. A data transmission between the sense amplifier block 109 and the read/write amplifier 120 is performed by a read only data bus lines 116-1, 116-2 and 116-3 connected to the read amplifier 110 when data is read, and by a write only data bus lines 117-1, 117-2 and 117-3 connected to the write amplifier 111 when data is written. In this embodiment, the write only data bus line 117-1 is placed between the read only column selection line 501 and the read only data bus line 116-1, and the write only data bus line 117-2 is placed between the read only column selection line 504 and the read only data bus line 116-1. The read only data bus line 116-2 is placed between the write only column selection line 507 and the write only data bus line 117-3, and the read only data bus line 116-3 is placed between write only column selection line 601 and the write only data bus line 117-3.

First, a description will be given of an example in which the write only data bus line 117-1 is placed between the read only column selection line 501 and the read only data bus line 116-1.

Let Cp' be a capacitance of a capacitor 602 existing between the read only column selection line 501 and the write only data bus line 117-1. A capacitance of a capacitor 603 existing between the write only data bus line 117-1 and the read only data bus line 116-1 is also Cp'. The capacitance Cp' is a little larger than the capacitance Cp of the capacitor 310 existing between the column selection line CLA and the data bus 121 shown in FIG. 3A. The read only data bus line 116-1 is shielded from the read only column selection line 501 by the write only data bus line 117-1 because the capacitors 603 and 604 are connected to the write only data bus line 117-1 having a constant voltage potential. Furthermore, the capacitance between the read only column selection line 501 and the read only data bus line 116-1 is reduced because the capacitor 603 and 604 are serially connected. The signal on the write only data bus line 117-1 does not change when the data on the read only data bus line 116-1 supplied from the memory cell array 106 selected by the read only column selection line 501 is transferred to the read amplifier 110. Therefore, a voltage variation Vp due to a cross-talk by the coupling capacitor existing between the read only column selection line 501 and the read only data bus line 116-1 is not generated similarly as shown in FIG. 4B when a signal on the read only column selection line 501 rises.

As a result, the semiconductor memory device having the high speed data bus 116-1 can be achieved because the coupling capacitance Cp between the read only column selection line 501 and the read only data bus line 116-1 is reduced.

On the other hand, the same effect as mentioned above can be achieved if the read only data bus line 116-2 is placed between the write only column selection line 507 and a write only data bus line 117-3.

Figure 7:
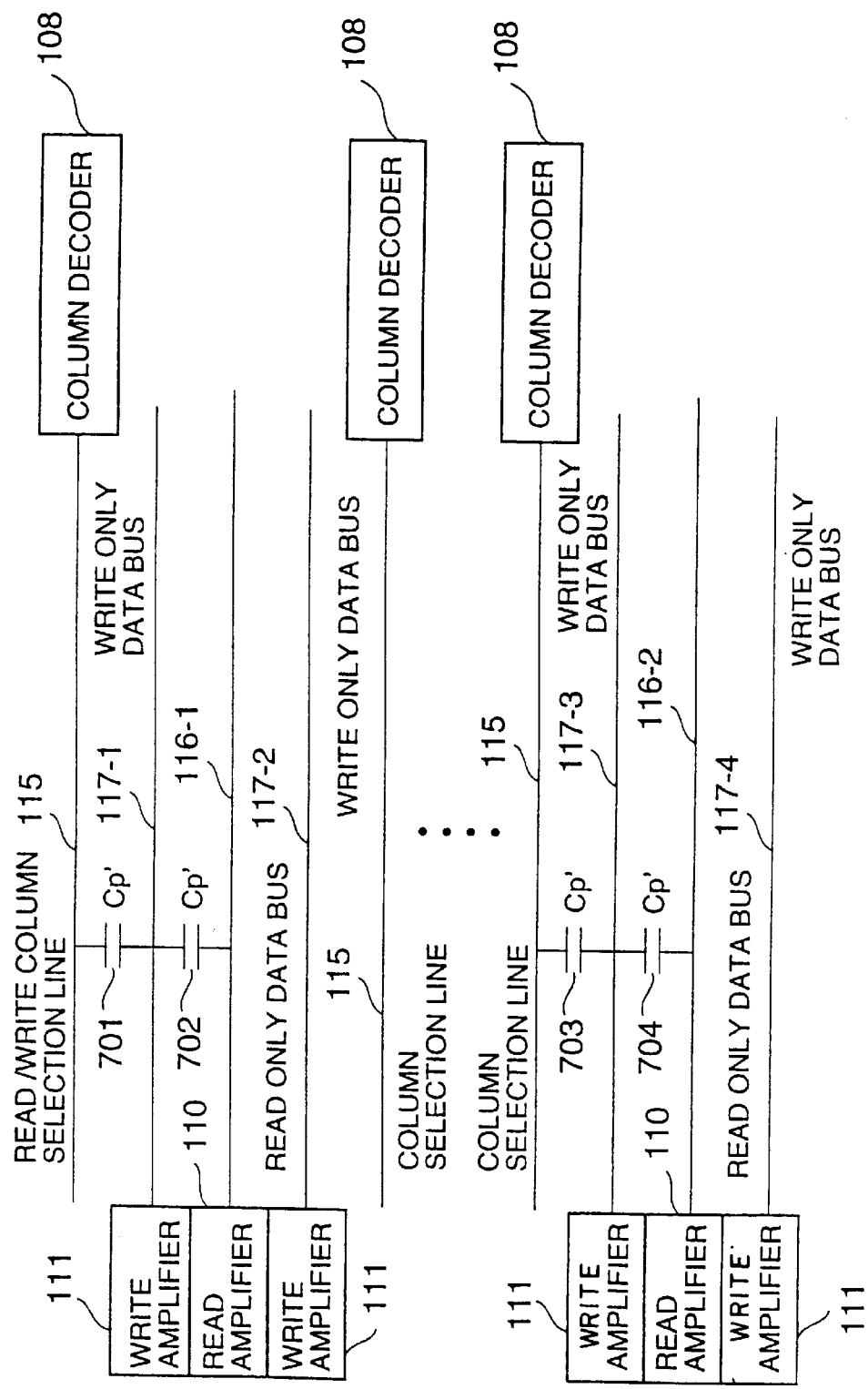
FIG. 7 shows a fourth embodiment of a semiconductor memory device according to the present invention.

Next, a fourth embodiment of the present invention will be explained. FIG. 7 shows the fourth embodiment of the semiconductor memory device according to the present invention. FIG. 7 shows a layout of a write only data bus line which serves as a shielding line placed between a read/write column selection line and a read only data bus line. In this embodiment, the sense amplifiers in the sense amplifier block 109 shown in FIG. 1 are selected by the column-decoder 108 through column selection lines 115 when data is read from the memory cell array 106 and is written to the memory cell array 106. A data transmission between the sense amplifier block 109 and the read/write amplifier 120 is performed by read only data bus lines 116-1 and 116-2 connected to the read amplifier 110 when data is read, and by write only data bus lines 117-1, 117-2, 117-3 and 117-4 connected to the write amplifier 111 when data is written. In this embodiment, the write only data bus line 117-1 is placed between the read/write column selection line 115 and the read only data bus line 116-1, and the write only data bus line 117-3 is placed between the read/write column selection line 115 and the read only data bus line 116-2.

First, a description will be given of an example in which the write only data bus line 117-1 is placed between the read/write column selection line 115 and the read only data bus line 116-1.

Let Cp' be a capacitance of a capacitor 701 existing between the read/write column selection line 115 and the write only data bus line 117-1. A capacitance of a capacitor 702 existing between the write only data bus line 117-1 and the read only data bus line 116-1 is also Cp'. The capacitance Cp' is a little larger than the capacitance Cp of the capacitor 310 existing between the column selection line CLA and the data bus 121 shown in FIG. 3A. The read only data bus line 116-1 is shielded from the read/write column selection line 115 by the write only data bus line 117-1 because the capacitors 701 and 702 are connected to the write only data bus line 117-1 having a constant voltage potential. Furthermore, the capacitance between the read/write column selection line 115 and the read only data bus line 116-1 is reduced because the capacitor 701 and 702 are serially connected. The signal on the write only data bus line 117-1 does not change when the data on the read only data bus line 116-1 supplied from the memory cell array 106 selected by the read/write column selection line 115 is transferred to the read amplifier 110. Therefore, a voltage variation Vp due to a cross-talk by the coupling capacitor existing between the read/write column selection line 115 and the read only data bus line 116-1 is not generated similarly as shown in FIG. 4B when a signal on the read/write column selection line 115 rises.

As a result, the semiconductor memory device having the high speed data bus 116-1 can be achieved because the coupling capacitance Cp existing between the read/write column selection line 115 and the read only data bus line 116-1 is reduced.

As mentioned above, the coupling capacitance existing between the column selection line and the data bus line can be reduced by placing a line, which serves as a shielding line and on which a signal does not change at the same time when a signal on the column selection line changes, between the column selection line and the data bus line.

The shielding line between the column selection line and the data bus line is described in the embodiments mentioned above. However, the present invention can also be applied to a shielding line between any lines.

The present invention is not limited to the specifically disclosed embodiments, and variations and modifications may be made without departing from the scope of the present invention.

The present application is based on Japanese priority application No. 11-122362 filed on Apr. 28, 1999, the entire contents of which are hereby incorporated by reference.

What is claimed is:

1. A semiconductor memory device comprising:
   data bus lines connected to a memory cell array;
   column selection lines, each used to select a column of said memory cell array; and
   a shielding line placed between a column selection line, that is one of said column selection lines, and a data bus line, that is a respective one of said data bus lines adjacent to said column selection line.

2. A semiconductor memory device as claimed in claim 1, wherein said shielding line is a line which reduces a capacitance of a coupling capacitor existing between the column selection line and the data bus line adjacent to the column selection line.

3. A semiconductor memory device as claimed in claim 1, wherein said shielding line is a line transmitting a signal which does not change at the same time when a signal on the column selection line changes.

4. A semiconductor memory device as claimed in claim 1, wherein said shielding line is a power supply line which supplies a power.

5. A semiconductor memory device as claimed in claim 1, wherein said shielding line is a ground line which supplies a core of the semiconductor memory device with a ground potential.

6. A semiconductor memory device as claimed in claim 4, wherein said shielding line is a power supply line which supplies a core of the semiconductor memory device with a power.

7. A semiconductor memory device as claimed in claim 4, wherein said shielding line is a shielding line connected to a power supply line which supplies the core of the semiconductor memory device with a power.

8. A semiconductor memory device as claimed in claim 3, wherein said line transmitting the signal which does not change at the same time when the signal on the column selection line changes is a write only column selection line which transmits a write only column selection signal to select said column of said memory cell array when data is written to said memory cell array placed between a read only data bus line which transmits read data from said memory cell array and a read only column selection line which transmits a read only column selection signal to select said column of said memory cell array when the data is read from said memory cell array.

9. A semiconductor memory device as claimed in claim 3, wherein said line transmitting the signal which does not change at the same time when the signal on the column selection line changes is a read only column selection line which transmits a read only column selection signal to select said column of said memory cell array when data is read from said memory cell array placed between a write only data bus line which transmits write data to said memory cell array and a write only column selection line which transmits a write only column selection signal to select said column of said memory cell array when the data is written to said memory cell array.

10. A semiconductor memory device as claimed in claim 3, wherein said line transmitting the signal which does not change at the same time when the signal on said column selection line changes is a write only data bus line which transmits write data to said memory cell array placed between a read only data bus line which transmits read data from said memory cell array and a read/write column selection line which transmits a read/write column selection signal to select said column of said memory cell array when the data is read from and write to said memory cell array.

* * * * *